United States Patent
Kashyap et al.

(10) Patent No.: US 10,472,713 B2
(45) Date of Patent: Nov. 12, 2019

(54) METHOD FOR CERAMIC MATRIX COMPOSITE WITH CARBON COATING FOR WETTING

(71) Applicant: United Technologies Corporation, Farmington, CT (US)

(72) Inventors: Tania Bhatia Kashyap, West Hartford, CT (US); Kathryn S. Read, Colchester, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 209 days.

(21) Appl. No.: 15/168,268

(22) Filed: May 31, 2016

(65) Prior Publication Data
US 2017/0342549 A1 Nov. 30, 2017

(51) Int. Cl.
C04B 35/626 (2006.01)
C04B 35/628 (2006.01)
C04B 35/80 (2006.01)
C04B 35/571 (2006.01)
C23C 16/04 (2006.01)

(52) U.S. Cl.
CPC .......... *C23C 16/045* (2013.01); *C04B 35/571* (2013.01); *C04B 35/6267* (2013.01); *C04B 35/62844* (2013.01); *C04B 35/62873* (2013.01); *C04B 35/62886* (2013.01); *C04B 35/62889* (2013.01); *C04B 35/62897* (2013.01); *C04B 35/806* (2013.01); *C04B 2235/48* (2013.01); *C04B 2235/5244* (2013.01); *C04B 2235/616* (2013.01)

(58) Field of Classification Search
CPC .............................. C03C 14/002; C04B 35/80
See application file for complete search history.

(56) References Cited

U.S. PATENT DOCUMENTS

| 5,039,635 | A | 8/1991 | Stempin et al. |
| 5,196,235 | A | 3/1993 | Parlier et al. |
| 5,628,938 | A | 5/1997 | Sangeeta et al. |
| 5,698,143 | A | 12/1997 | Tani et al. |
| 5,723,213 | A | 3/1998 | Carpenter et al. |
| 5,853,653 | A | 12/1998 | Donato et al. |
| 6,277,440 | B1 | 8/2001 | Reynolds |
| 6,350,713 | B1 | 2/2002 | Petrak |

(Continued)

FOREIGN PATENT DOCUMENTS

| EP | 0549224 | 6/1993 | |
| EP | 0549224 A1 * | 6/1993 | .......... C04B 35/589 |
| EP | 1081115 | 3/2001 | |

OTHER PUBLICATIONS

Extended European Search Report for European Application No. 17173550.9 dated Oct. 9, 2017.

*Primary Examiner* — Alex A Rolland
(74) *Attorney, Agent, or Firm* — Carlson, Gaskey & Olds, P.C.

(57) ABSTRACT

A method of fabricating a ceramic matrix composite includes infiltrating pores of a porous structure with a preceramic matrix polymer using a composite molding technique. The porous structure includes fibers and an exposed carbon coating on the fibers. The preceramic matrix polymer wets the exposed carbon coating. The preceramic matrix polymer is then pyrolyzed to convert the preceramic matrix polymer to a ceramic matrix.

12 Claims, 1 Drawing Sheet

(56) References Cited

U.S. PATENT DOCUMENTS

| | | |
|---|---|---|
| 8,828,540 B2 | 9/2014 | Schmidt et al. |
| 2005/0276961 A1 | 12/2005 | Sherwood et al. |
| 2007/0292690 A1 | 12/2007 | Schmidt |
| 2008/0003357 A1 | 1/2008 | Schmidt et al. |
| 2010/0239842 A1 | 9/2010 | Schmidt |
| 2011/0071013 A1 | 3/2011 | Newton et al. |
| 2012/0020863 A1 | 1/2012 | Plaisantin et al. |
| 2013/0167374 A1 | 7/2013 | Kirby et al. |
| 2015/0045200 A1 | 2/2015 | Schmidt et al. |

\* cited by examiner

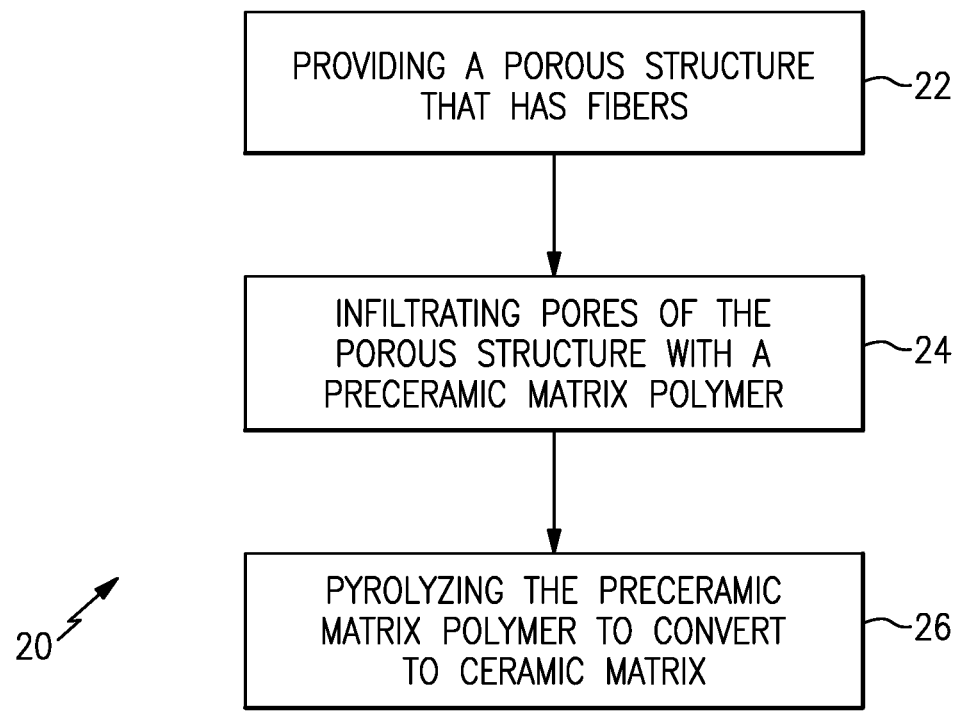

METHOD FOR CERAMIC MATRIX COMPOSITE WITH CARBON COATING FOR WETTING

BACKGROUND

Ceramic matrix composites ("CMC") generally include a carbon or ceramic fiber reinforcement material disposed in a carbon or ceramic matrix material. The reinforcement material serves as a load-bearing constituent, while the matrix material protects the reinforcement material and transfers loads to the fibers. Processes for fabricating a CMC may include, for example, depositing the matrix material around the fibers using chemical vapor infiltration (CVI), gas or liquid phase reaction bonding, slurry infiltration, polymer impregnation and pyrolysis, or melt infiltration.

SUMMARY

A method of fabricating a ceramic matrix composite according to an example of the present disclosure includes infiltrating pores of a porous structure with a preceramic matrix polymer using a composite molding technique. The porous structure has fibers and an exposed carbon coating on the fibers. The preceramic matrix polymer wets the exposed carbon coating, and the preceramic matrix polymer is then pyrolyzed to convert the preceramic matrix polymer to a ceramic matrix.

In a further embodiment of any of the foregoing embodiments, the ceramic matrix has residual pores which infiltrate the residual pores with preceramic infiltration polymer and the preceramic infiltration polymer is pyrolyzed to convert the preceramic infiltration polymer to additional ceramic matrix.

In a further embodiment of any of the foregoing embodiments, the exposed carbon coating has a nanosized thickness.

In a further embodiment of any of the foregoing embodiments, the exposed carbon coating has a thickness of less than approximately 50 nanometers.

In a further embodiment of any of the foregoing embodiments, the exposed carbon coating has a thickness of less than approximately 10 nanometers.

In a further embodiment of any of the foregoing embodiments, the fibers have a fiber diameter D and the exposed carbon coating has a thickness T, and a ratio of D/T is in a range of 20000-100.

In a further embodiment of any of the foregoing embodiments, the range is 15000-200.

In a further embodiment of any of the foregoing embodiments, the ratio is greater than or equal to 1000.

In a further embodiment of any of the foregoing embodiments, the exposed carbon coating is continuous.

In a further embodiment of any of the foregoing embodiments, the exposed carbon coating is discontinuous.

In a further embodiment of any of the foregoing embodiments, the fibers are silicon carbide fibers.

In a further embodiment of any of the foregoing embodiments, the exposed carbon coating includes graphite.

A method of fabricating a ceramic matrix composite according to an example of the present disclosure includes modifying a wetting property between a preceramic matrix polymer and fibers of a porous structure by providing an exposed carbon coating on the fibers. The wetting property controls a pore structure of the preceramic matrix polymer once pyrolyzed to convert the preceramic matrix polymer to a ceramic matrix infiltrating pores of the porous structure with the preceramic matrix polymer. The preceramic matrix polymer wets the carbon coating according to the modified wetting property, and the preceramic matrix polymer is then pyrolyzed to convert the preceramic matrix polymer to a ceramic matrix that has a pore structure according to the modified wetting property.

In a further embodiment of any of the foregoing embodiments, the modifying of the wetting property includes decreasing wetting.

In a further embodiment of any of the foregoing embodiments, the ceramic matrix has residual pores infiltrate the residual pores with preceramic infiltration polymer and pyrolyzing the preceramic infiltration polymer to convert the preceramic infiltration polymer to additional ceramic matrix.

In a further embodiment of any of the foregoing embodiments, the exposed carbon coating has a thickness of less than approximately 50 nanometers.

In a further embodiment of any of the foregoing embodiments, the fibers have a fiber diameter D and the exposed carbon coating has a thickness T, and a ratio of D/T is in a range of 20000-100.

In a further embodiment of any of the foregoing embodiments, the ratio is greater than or equal to 1000.

BRIEF DESCRIPTION OF THE DRAWINGS

The various features and advantages of the present disclosure will become apparent to those skilled in the art from the following detailed description. The drawings that accompany the detailed description can be briefly described as follows.

FIG. 1 illustrates an example method of fabricating a ceramic matrix composite according to an embodiment.

DETAILED DESCRIPTION

Ceramic matrix composites ("CMC") can generally be fabricated using known techniques. The parameters of a processing technique, such as temperatures, pressures, etc., can be adjusted to influence the end microstructure of the CMC. However, there are limits to how much such parameters can be adjusted for a given CMC, and thus limits on how much the end microstructure of the CMC can be controlled for a given processing technique.

FIG. 1 schematically illustrates an example method 20 of fabricating a ceramic matrix composite. As will be described, the method 20 involves the use of a coating on the fibers of the CMC, which expands control over processing and thus over the end microstructure. In other words, the coating provides an additional "tool" for tailoring the end microstructure.

The method 20 includes processing steps 22, 24, and 26. As will be appreciated, the steps 22, 24, and 26 may be conducted separately, conducted in a combined manner, and/or conducted in conjunction with other processing steps. At step 22, a porous structure is provided. The porous structure may be fully or partially fabricated as part of the method 20, or pre-fabricated and supplied for the method 20 at step 22. The porous structure includes ceramic fibers that will serve as the reinforcement material in the end CMC. For example, the porous structure may be a fiber layer or sheet, a lay-up of stacked fiber layers, or a three-dimensional network of fibers. The ceramic fibers may be single filaments or fibers, or bundles of filaments or fibers. The ceramic fibers may be formed of oxide ceramic fibers or non-oxide ceramic fibers, and may include one or more interfacial coating layers. Example interfacial coating layers may include, but are not limited to, boron nitride, silicon nitride, and combinations thereof.

The ceramic fibers also include an exposed carbon coating on the fibers. The term "exposed" refers to the carbon coating being bare such that the carbon coating has free surfaces at the pores of the porous structure. For example, if the fibers include one or more interfacial coating layers, the carbon coating is disposed on the outermost interfacial layer such that the carbon coating is the outermost layer overall. The exposed carbon coating may contain various types of carbon allotropes, but most typically will be primarily or fully graphite or pyrolytic carbon. The carbon coating may be deposited on the fibers using vapor deposition, for example chemical vapor deposition via gas-phase reactions of one or more precursors, but is not limited to that deposition technique.

At step 24, the pores of the porous structure are infiltrated with a preceramic matrix polymer. The preceramic matrix polymer is a polymer that, when later subjected to a thermal treatment, decomposes into a ceramic material. Example preceramic matrix polymers may include, but are not limited to, polysilanes, polysilazanes, and polysiloxanes. An example polysilane is polycarbosilane, such as poly(allyl) carbosilane, which thermally decomposes under vacuum or an inert cover gas into silicon carbide. Other preceramic matrix polymers may decompose into nitrides, carbides, oxides, or combinations thereof. In further examples, the preceramic matrix polymer includes only the polymer, or the polymer and additional constituents. The additional constituents may be, but are not limited to, additives, such as processing aids, reinforcement materials, metals, barrier phases, oxygen getters, and the like. The reinforcement materials may include, but are not limited to, ceramic fillers, such as silicon carbide, silicon nitride, boron carbide, or carbon particles.

In one example, composite molding technique is used to infiltrate the preceramic matrix polymer into the pores of the porous structure. The composite molding technique generally involves flow or movement of liquid preceramic matric polymer across the free surfaces of the carbon coating at the pores of the porous structure. The composite molding may be or may include, but is not limited to, resin transfer molding, compression molding, autoclave molding, or other "green state" technique that involves flow or movement of the liquid across the surfaces of the carbon coating. For instance, resin transfer molding may include placement of the porous structure into a mold, evacuation of the mold, and transfer of liquid preceramic matrix polymer into the mold to infiltrate between the fibers into the pores of the porous structure. The liquid cures and solidifies and the "green" state intermediate CMC can then be removed from the mold. Additionally or alternatively, the liquid may solidify and the intermediate CMC may be removed and subjected to a separate curing process to cross-link or more fully cross-link the preceramic polymer.

At step 26, the green state intermediate CMC is pyrolyzed to convert the preceramic matrix polymer to ceramic matrix. The parameters of the pyrolysis depend on the selected type of preceramic matrix polymer. Generally, the pyrolysis is conducted at temperatures above approximately 800° C. For non-oxide ceramics, the pyrolysis is also conducted under vacuum and/or under an inert cover gas, such as argon or helium.

Most typically, after the pyrolysis, the ceramic matrix will have residual pores. In this regard, subsequent processing techniques can be used to further densify the CMC by infiltrating the residual pores with additional material. The additional material may be, but is not limited to, additional ceramic material. For instance, polymer impregnation and pyrolysis can be used to infiltrate the residual pores with preceramic infiltration polymer. The preceramic infiltration polymer may be the same composition or a different composition than the preceramic matrix polymer used initially. The preceramic infiltration polymer is then pyrolyzed in a similar manner as the preceramic matrix polymer, to convert the preceramic infiltration polymer to additional ceramic matrix. The polymer impregnation and pyrolysis may be repeated to further fill and densify the CMC.

The infiltration of the liquid preceramic matrix polymer into the porous structure during the composite molding technique influences the pore structure of the end CMC. For instance, as the liquid infiltrates and flows among the fibers it wets the fibers. "Wetting" and variations thereof refer to the ability of the liquid to contact the fibers. For example, on a surface with high wetting properties a liquid forms a low contact angle with the surface, while on a surface with low wetting properties the liquid forms a high contact angle with the surface.

The exposed carbon coating modifies the wetting properties of the fibers with regard to the (liquid) preceramic matrix polymer. For instance, the wetting of the fibers with the exposed carbon coating is different than the wetting would otherwise be without the exposed carbon coating. In this regard, the exposed carbon coating is provided on the fibers to modify the wetting of the fibers, and thus expand control over the pore structure of the preceramic matrix polymer once pyrolyzed at step 26. For example, the exposed carbon coating modifies the wetting property of the native or otherwise coated fiber with respect to the (liquid) preceramic matrix polymer. In turn, the modified wetting influences the pore structure of the ceramic matrix. As an example, decreased wetting may create a more open or connected pore structure in comparison to wetting of the fibers without the exposed carbon coating, which could enable an improved optimization of the subsequent densification of the CMC. The wetting can thus be selectively controlled by providing more or less carbon to ultimately provide more or less porosity in the ceramic matrix, which then permits the porosity to be tailored for a particular end use or a downstream process. "Pore structure" may refer to the spatial distribution, size, or shape of the pores, all of which can be observed/measured through microstructural and statistical analysis.

In further examples, the exposed carbon coating is controlled in order to control the modification of the wetting property of the fibers. For example, the thickness of the carbon coating is controlled to influence wetting behavior. For instance, unlike an interfacial coating layer that tends to be thicker, the exposed carbon coating is relatively thin in comparison to the size of the fibers. For example, the fibers have a fiber diameter D, the exposed carbon coating has a thickness T, and a ratio of D/T is in a range of 20000-100 micrometer/micrometer or equivalent units. In a further example, the range is 15000-200 micrometer/micrometer or equivalent units. In a further example, the ratio is greater than or equal to 1000 micrometer/micrometer or equivalent units, which is representative of a "flash" coating of carbon on the fibers to modify the wetting. In a further example, the thickness T is approximately 50 nanometers or less, or approximately 10 nanometers or less, and the exposed carbon coating is continuous.

In another example, the exposed carbon coating is discontinuous such that the surfaces of the fibers (or surfaces of the outermost interfacial layer) are incompletely covered by the carbon coating. Thus, the thickness of the exposed carbon coating relative to the fiber size and the continuity of the carbon coating can be used to modify the wetting property of the fibers, and thus adjust the pore structure of the ceramic matrix. For example, an increased pore uniformity may be used to enable better infiltration of the preceramic infiltration polymer into the ceramic matrix and thus enhance properties of the end CMC.

The carbon coating may or may not be present in the final CMC, depending on the composition of the preceramic polymer, processing temperature, and processing environment. For example, if the preceramic matrix polymer and/or the preceramic infiltration polymer has constituents that are reactive with the carbon, the carbon may react to form a carbon-containing ceramic layer in place of the carbon coating. Additionally or alternatively, the carbon may migrate such that the carbon coating or is fully or partially depleted in the end CMC.

Although a combination of features is shown in the illustrated examples, not all of them need to be combined to realize the benefits of various embodiments of this disclosure. In other words, a system designed according to an embodiment of this disclosure will not necessarily include all of the features shown in any one of the FIGURES or all of the portions schematically shown in the FIGURES. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from this disclosure. The scope of legal protection given to this disclosure can only be determined by studying the following claims.

What is claimed is:

1. A method of fabricating a ceramic matrix composite, the method comprising:
   infiltrating pores of a porous structure with a preceramic matrix polymer using a composite molding technique, the porous structure including fibers and an exposed carbon coating on the fibers, the preceramic matrix polymer wetting the exposed carbon coating wherein the exposed carbon coating is discontinuous and has a thickness of less than approximately 10 nanometers; and
   pyrolyzing the preceramic matrix polymer to convert the preceramic matrix polymer to a ceramic matrix.

2. The method as recited in claim 1, wherein the ceramic matrix has residual pores, and further comprising infiltrating the residual pores with preceramic infiltration polymer and pyrolyzing the preceramic infiltration polymer to convert the preceramic infiltration polymer to additional ceramic matrix.

3. The method as recited in claim 1, wherein the fibers have a fiber diameter D and the exposed carbon coating has a thickness T, and a ratio of D/T is in a range of 20000-100.

4. The method as recited in claim 3, wherein the range is 15000-200.

5. The method as recited in claim 3, wherein the ratio is greater than or equal to 20000-10000.

6. The method as recited in claim 1, wherein the fibers are silicon carbide fibers.

7. The method as recited in claim 1, wherein the exposed carbon coating includes graphite.

8. A method of fabricating a ceramic matrix composite, the method comprising:
   modifying a wetting property between a preceramic matrix polymer and fibers of a porous structure by providing an exposed carbon coating on the fibers, wherein the wetting property controls a pore structure of the preceramic matrix polymer once pyrolyzed to convert the preceramic matrix polymer to a ceramic matrix and wherein the exposed carbon coating is discontinuous and has a thickness of less than approximately 10 nanometers;
   infiltrating pores of the porous structure with the preceramic matrix polymer, the preceramic matrix polymer wetting the carbon coating according to the modified wetting property; and
   pyrolyzing the preceramic matrix polymer to convert the preceramic matrix polymer to the ceramic matrix that has the pore structure according to the modified wetting property.

9. The method as recited in claim 8, wherein the modifying of the wetting property includes decreasing wetting.

10. The method as recited in claim 8, wherein the ceramic matrix has residual pores, and further comprising infiltrating the residual pores with preceramic infiltration polymer and pyrolyzing the preceramic infiltration polymer to convert the preceramic infiltration polymer to additional ceramic matrix.

11. The method as recited in claim 8, wherein the fibers have a fiber diameter D and the exposed carbon coating has a thickness T, and a ratio of D/T is in a range of 20000-100.

12. The method as recited in claim 11, wherein the ratio is greater than or equal to 20000-1000.

* * * * *